US006847526B2

(12) United States Patent
Robbins et al.

(10) Patent No.: US 6,847,526 B2
(45) Date of Patent: *Jan. 25, 2005

(54) SUB RACK BASED VERTICAL HOUSING FOR COMPUTER SYSTEMS

(75) Inventors: Shane R. Robbins, Santaquin, UT (US); Clark M. Roundy, South Jordan, UT (US); Jason Lowry, Sandy, UT (US)

(73) Assignee: Linux Networx, Bluffdale, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/660,173

(22) Filed: Sep. 11, 2003

(65) Prior Publication Data

US 2004/0047133 A1 Mar. 11, 2004

Related U.S. Application Data

(63) Continuation of application No. 10/252,654, filed on Sep. 23, 2002, now Pat. No. 6,661,667, which is a continuation of application No. 09/955,562, filed on Sep. 18, 2001, now Pat. No. 6,487,080.
(60) Provisional application No. 60/234,858, filed on Sep. 22, 2000.

(51) Int. Cl.[7] .................................................. H05K 5/03
(52) U.S. Cl. ..................... 361/727; 361/726; 312/223.2; 345/163
(58) Field of Search .............................. 361/685–686, 361/724–727; 312/223.1–223.6; 709/220; 345/157, 163–168

(56) References Cited

U.S. PATENT DOCUMENTS

| D367,849 S | 3/1996 | Pedinielli et al. .......... D13/184 |
|---|---|---|
| 5,896,273 A | 4/1999 | Varghese et al. ............. 361/724 |
| D409,171 S | 5/1999 | Wu ............................ D14/114 |
| 5,929,377 A * | 7/1999 | Hamilton et al. .......... 174/35 R |
| 6,052,278 A | 4/2000 | Tanzer et al. ................ 361/685 |
| 6,129,429 A | 10/2000 | Hardt et al. .............. 312/223.2 |
| 6,192,401 B1 | 2/2001 | Modiri et al. ................ 709/220 |
| 6,288,902 B1 | 9/2001 | Kim et al. ................... 361/725 |
| 6,317,334 B1 | 11/2001 | Abruzzini et al. ........... 361/694 |
| 6,480,391 B1 | 11/2002 | Monson et al. ............. 361/752 |
| 6,487,080 B2 * | 11/2002 | Robbins et al. ............. 361/727 |
| 6,490,152 B1 | 12/2002 | White et al. ................. 361/684 |
| 6,661,667 B2 * | 12/2003 | Robbins et al. ............. 361/727 |

* cited by examiner

*Primary Examiner*—Hung Van Duong
(74) *Attorney, Agent, or Firm*—Madson & Metcalf

(57) ABSTRACT

A structure for vertically housing multiple computer systems is disclosed. The structure includes a bottom support member and a top support member substantially parallel to the bottom support member. The top support member is attached to the bottom support member by two side members. Bottom guides are mounted to the bottom support member, and top guides are mounted to the top support member. The top guides are substantially parallel to the bottom guides and are substantially aligned with the bottom guides. A computer system having a top groove and a bottom groove slides into a computer space in between the top support member and the bottom support member by having the top groove align with a top guide and by having the bottom groove align with a bottom guide to provide a fitting relationship. The computer system slides into the computer space to a non-backplaned rear.

1 Claim, 6 Drawing Sheets

SUB RACK BASED VERTICAL HOUSING FOR COMPUTER SYSTEMS

RELATED APPLICATIONS

This application is a continuation of U.S. patent application Ser. No. 10/252,654 entitled "Sub Rack Based Vertical Housing for Computer Systems," filed Sep. 23, 2002, now U.S. Pat. No. 6,661,667, which is a continuation of U.S. patent application Ser. No. 09/955,562 entitled "Sub Rack Based Vertical Housing for Computer Systems." filed Sep. 18, 2001, now U.S. Pat. No. 6,487,080, which is related to, and claims priority from, U.S. Provisional Application No. 60/234,858, entitled "Method and apparatus for rack mounting processors for use in high performance and high availability computing," filed Sep. 22, 2000, which are all hereby incorporated by reference in their entireties.

TECHNICAL FIELD

This invention relates generally to housings for computer systems, and is more particularly directed toward structures for vertically housing multiple computer systems.

BACKGROUND

Typically large racks are used to hold multiple computer systems. Generally, a user needs tools and time to place a computer system into such a rack, or to remove a computer system. It is desirable to provide structures for holding computer systems, to provide structures for the computer systems themselves that allow the computers to be more efficiently placed into and/or removed from a rack, or to meet necessary density requirements.

As the size and complexity of software grows, the ability of a single computer to handle all of the requirements associated with the software diminishes. One way to handle these increasingly complex software systems is to use a group of computers working together. A group of computers working together in a distributed computer system is referred to as a cluster. Computer clusters are an increasingly popular alternative to more traditional computer architectures and supercomputers.

The trend in high-performance computing is to move away from specialized platforms, such as mainframes or shared-memory supercomputers, to computer clusters—general purpose systems consisting of loosely coupled components built up from single or multi-processor workstations or PCs. This approach has a number of advantages including that of being able to build a platform at a reasonable cost when compared to the alternatives.

Each individual computer of the cluster is referred to as a node. Nodes of a cluster work together as a single entity or in groups to cooperatively provide processing power and mass storage.

The nodes are interconnected to provide a single computing system. With the distributed computing system of a cluster, the processing load is spread over more than one computer, which may eliminate points of failure that could cause a single computer to abort execution.

Advances in computer networking and microprocessor performance are making clustering an appealing vehicle for cost effective parallel computing. Clusters built using relatively inexpensive hardware and software components are playing a major role in redefining the concept of supercomputing.

It should be understood that groups of computers are not necessarily part of a cluster, but may simply be grouped together for some other reason. For example, many web site hosting providers have multiple computers close together that are hosting the web sites of various companies. These computers are usually close together because they are at the same location and to make it easier to support and maintain the computers. Thus, although groups of computers working together in a distributed computing system are referred to as a cluster, a group of computers together does not necessarily mean that the computers are part of a cluster.

SUMMARY OF THE INVENTION

A structure for vertically housing multiple computer systems is disclosed. The structure includes a bottom support member and a top support member substantially parallel to the bottom support member. The top support member is attached to the bottom support member by two side members. Bottom guides are mounted to the bottom support member, and top guides are mounted to the top support member. The top guides are substantially parallel to the bottom guides and are substantially aligned with the bottom guides. A computer system having a top groove and a bottom groove slides into a computer space in between the top support member and the bottom support member by having the top groove align with a top guide and by having the bottom groove align with a bottom guide to provide a fitting relationship. The computer system slides into the computer space to a non-backplaned rear.

In embodiments disclosed herein, the structure may further comprise a plurality of integrated semi-locking mechanisms. Each bottom guide may include an indentation to mate with a projection of the bottom groove to achieve an integrated semi-locking mechanism.

The structure may include a non-backplaned rear that is substantially open to allow access to the computer systems.

In embodiments discussed below, the structure may include five bottom guides and five top guides to provide five guide pairs. Five computer systems may be removably slid into the structure wherein each computer system slides along a guide pair.

The structure may be used with various kinds of computer systems and for various reasons. For example, the structure may be used to house nodes of a cluster in a distributed computing system.

A computer system is also disclosed for vertical placement in a computer system structure. The computer system includes a processor and a communications component in electronic communication with the processor for electronic communications. A non-backplaned communications port is also included in electronic communications with the communications component for electronic communications. The computer system also includes memory in electronic communication with the processor for storing data. A housing houses the processor, the communications component and the memory. The housing is substantially rectangular and includes a top, a bottom and a rear. The top includes a top groove and the bottom includes a bottom groove. The top and bottom grooves are substantially parallel and aligned so that the computer system may be vertically placed into the computer system structure by sliding the computer system along a pair of guides of the computer system structure aligned with the grooves of the housing. The computer system slides back to the rear such that the non-backplaned communications port is accessible.

In embodiments of the computer system disclosed herein the housing may be substantially enclosed. Further, the bottom groove may include a projection to mate with an indentation of the computer system structure. The computer system may be used as a node of a cluster.

BRIEF DESCRIPTION OF THE DRAWINGS

The present embodiments will become more fully apparent from the following description and appended claims, taken in conjunction with the accompanying drawings. Understanding that these drawings depict only typical embodiments and are, therefore, not to be considered limiting of the invention's scope, the embodiments will be described with additional specificity and detail through use of the accompanying drawings in which:

DETAILED DESCRIPTION

It will be readily understood that the components of the embodiments as generally described and illustrated in the Figures herein, could be arranged and designed in a wide variety of different configurations. Thus, the following more detailed description of the embodiments of the system and method of the present invention, as represented in the Figures, is not intended to limit the scope of the invention, as claimed, but is merely representative of the embodiments of the invention.

An embodiment of a structure for vertically housing multiple computer systems is disclosed. Multiple computer systems may be placed together in a rack, cabinet, enclosure, etc., for various reasons. One example is that of web site hosting providers that have multiple computers close together to host the web sites of various companies. These computers are usually close together because they are at the same location and also to make it easier to support and maintain the computers. However, these systems are not typically part of a cluster, but are simply separate computer systems housed in a common rack or location. The embodiments herein may be used with computer systems in general and are not limited to being used with clusters. Accordingly, the embodiments herein may easily be used to house computer systems that are not operating in a distributed computing environment (i.e., a cluster).

Figure 1:
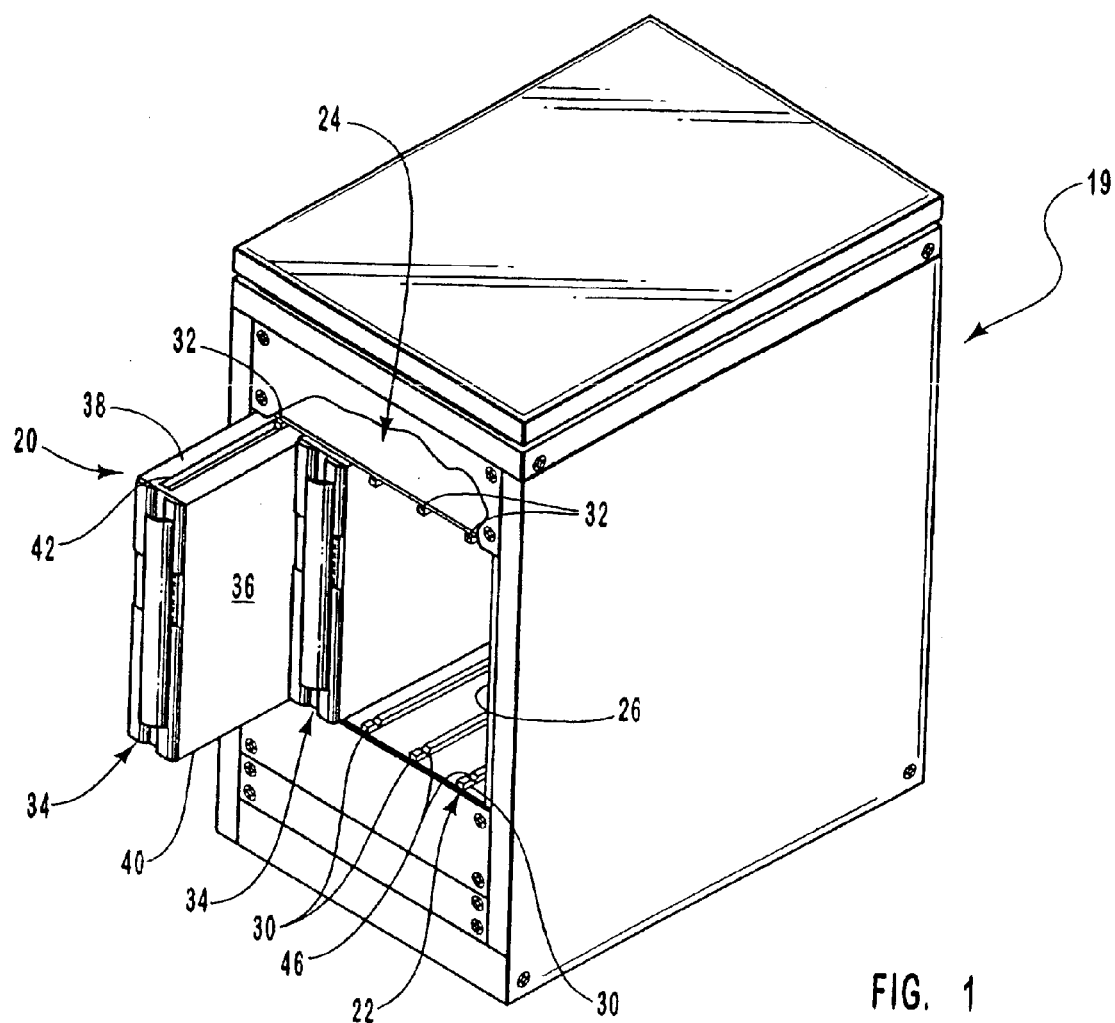
FIG. 1 is a perspective and partial cutaway view of an embodiment of a sub rack in a rack.

The structure for vertically housing multiple computer systems may be embodied in various forms and through various materials. FIG. 1 is a perspective view of an embodiment of the structure being used in combination with a rack 19. The embodiment illustrated in FIG. 1 is referred to herein as a sub rack 20. The sub rack 20 includes a bottom support member 22 and a top support member 24 connected to each other through two side members, a first side member 26 and a second side member 28. Those skilled in the art will appreciate the various ways in which these components may be made. In addition, there are a number of ways in which these components may be connected. For example, the components may be connected through the use of fasteners (screws, swedge mounted nuts, clips, etc.), or through welding, etc.

The bottom support member 22 includes a plurality of bottom guides 30 mounted to the bottom support member 22. Similarly, the top support member 24 includes a plurality of top guides 32 mounted to the top support member 24. In the embodiment of the sub rack 20 shown in FIG. 1, the top support member 24 and the bottom support member 24 are symmetrical such that the top guides 32 align with the bottom guides 30. The open space between the top and bottom support members 24, 22 and between the side members 26, 28 is used for holding computer systems 34.

In one embodiment, the guides 30, 32 may be made out of ultra high molecular weight polyethylene. Alternatively, the guides 30, 32 may be made out of nylon, delron, aluminum, or any variety of plastics or metals. The guides 30, 32 may be cut, milled, molded, or formed in various other ways, as will be appreciated by those skilled in the art. The guides 30, 32 may be attached via screws threaded into the material. Inserts may also be used. Alternatively, an adhesive may be used to attach the guides 30, 32 to the support members 22, 24. In addition, the guides 30, 32 may be an integral part of the support members 22, 24.

The computer system 34 includes a housing 36 for the components of the computer system 34. As shown, the housing 36 is substantially rectangular and includes a top 38, a bottom 40 and a rear. The top 38 includes a top groove 42 that allows a top guide 32 to fit therein and slide therethrough. Similarly, the bottom 40 includes a bottom groove 44 that allows a bottom guide 30 to fit therein and slide therethrough. In operation, to place a computer system 34 into the sub rack 20, a user first aligns the top groove 42 with a top guide 32 and aligns the bottom groove 44 with a bottom guide 30 and then the user simply slides the computer system 34 into the sub rack 20. Matching guides 30, 32 are used for a particular computer system 34. For example, the first top guide 32 from the right is used in conjunction with the first bottom guide 30 from the right to slide a computer system 34 into the sub rack 20. The second guide 32 is used in conjunction with the second bottom guide 30, and so forth. Through the use of the guides 30, 32 and the sub rack 20, the computer system 34 is vertically placed into the sub rack 20. A plurality of computer systems 34 may all be placed vertically in the sub rack 20 in a side-by-side fashion.

The housing 36 may be made using standard manufacturing techniques known by those skilled in the art. Different types of materials may be used for the housing 36 including a variety of plastics, metals, etc. For example, cold rolled steel, aluminum or aircraft aluminum may be used. These different materials may be formed, machined, molded, etc. to form the housing 36.

As discussed, multiple computer systems 34 may be used together in a cluster. When computer systems 34 are part of a cluster, they may be referred to as nodes. Thus, a node is a computer system 34, but a computer system 34 is not necessarily serving as a node. The embodiments herein may be used with clusters, but are not limited to this kind of environment. For illustrative purposes, the computer system 34 may also be referred to as a node.

In the embodiments herein, the computer system or node 34 slides back to the rear of the sub rack 20 which is a non-backplaned rear. The term non-backplaned rear means that there is not a backplane along the rear of the sub rack 20 that the computer or node 34 would need to plug into or slide into to enable electronic communications with other components also in communication with the backplane. The sub rack 20 is substantially open in the rear and hence includes a non-backplaned rear. The openness of the non-backplaned rear will be illustrated in FIG. 6.

Typically the computer or node 34 slides smoothly along the guides 30, 32 into the node space. Because there is no backplane, the node 34 (more generally the computer) may slide when it is undesirable. A semi-locking mechanism may be provided to provide some means for the node 34 to be semi-locked into position. An integrated semi-locking mechanism may be used. As shown, each bottom guide 30 includes an indentation 46 to mate with a projection in the bottom groove 44 that provides a semi-locking mechanism that does not require tools to put the node 34 in place. A user simply slides the node 34 into the node space until the projection fits into the indentation 46 and seats itself 34 into place. To unlock the node 34, a user slightly lifts and then pulls the node 34 enough to bring the projection out of the indentation 46 thus allowing free sliding of the node 34.

Figure 3:
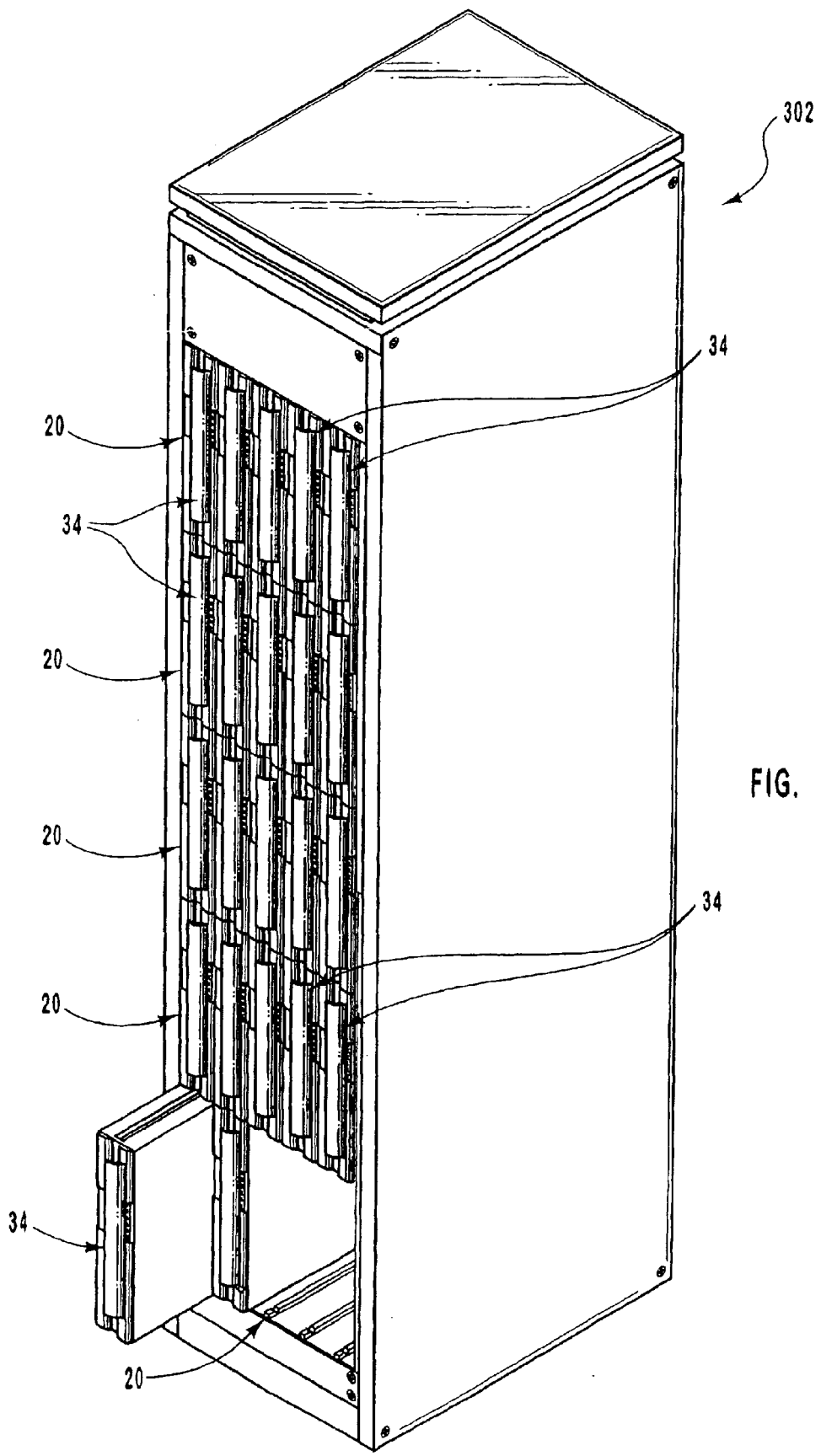
FIG. 3 is a perspective view of a rack that includes five sub racks.

As will be illustrated in FIG. 3, the sub rack 20 may be placed into a larger rack, sometimes referred to as a modular rack, a data rack or a cabinet. Depending on the height and/or size of the rack and the size of the nodes 34, various numbers of nodes 34 may be placed into a sub rack 20. One standard rack size is a 19-inch rack. The sub rack 20 may be designed to fit into any sized rack, including the 19-inch rack. In the embodiment shown in FIG. 1, five guides 30 are placed on the bottom support member 22 and give guides 32 are placed on the top support member 24 to allow five nodes 34 to be placed into the sub rack 20. Of course, other sizes and configurations of nodes 34 and sub racks 20 may be used.

Figure 2:
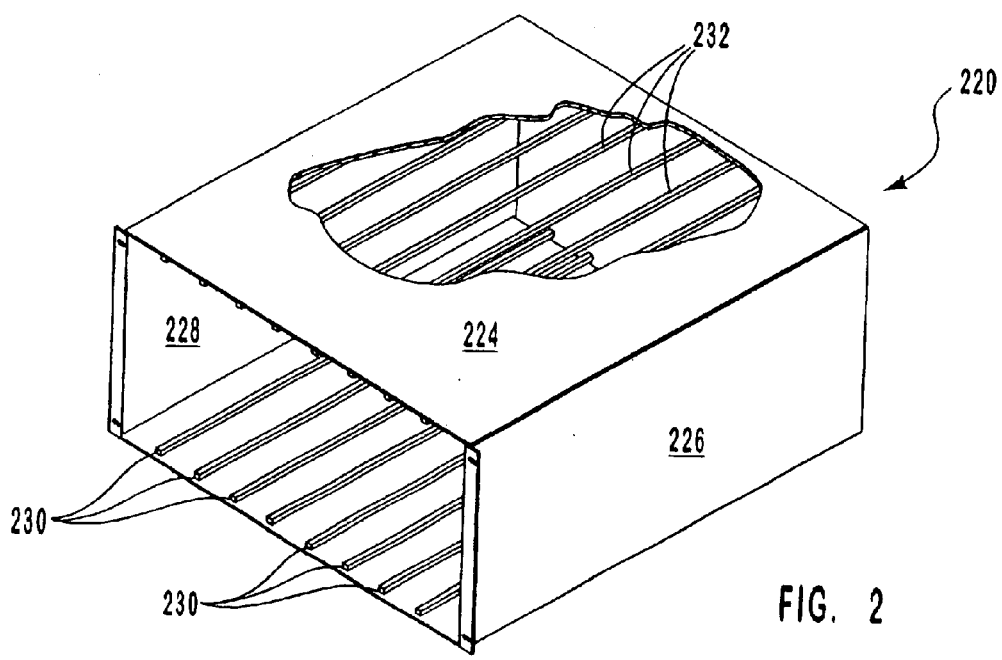
FIG. 2 is a perspective and partial cutaway view of another embodiment of a sub rack.

FIG. 2 is a perspective and partial cutaway view of a sub rack 220 that may include up to eight nodes 236 through use of the eight top guides 232 and eight bottom guides 230. As shown, the embodiment of FIG. 2 does not include a semi-locking mechanism.

FIG. 3 is a perspective view of a rack 302 that includes five sub racks 20. Each sub rack 20 shown in FIG. 3 includes five nodes 34. The rack 302 shown in FIG. 3 is a standard 19-inch rack that is commercially available.

Those skilled in the art will appreciate the various ways in which a sub rack 20 may be placed into the rack 302. For example, the sub rack 20 may be connected to the rack through the use of screws, bolts, etc.

Figure 4:
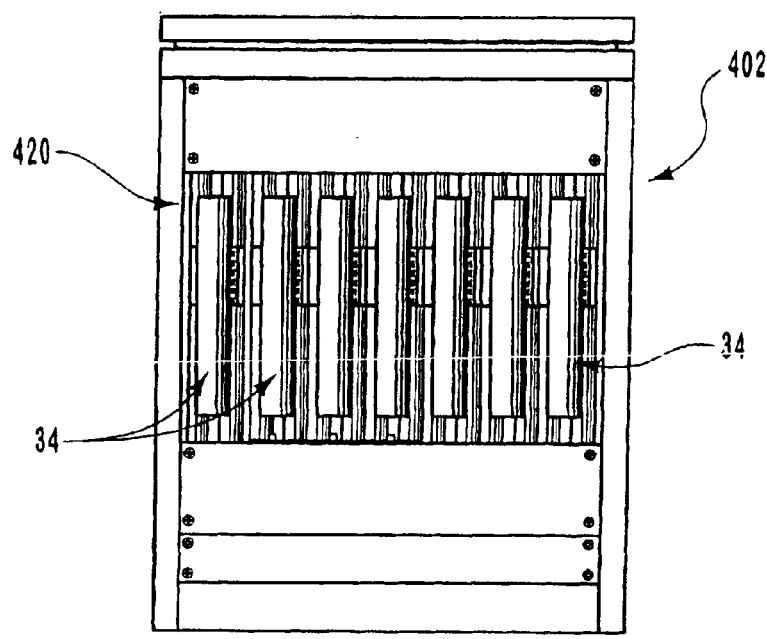
FIG. 4 is a front view of a rack that includes one sub rack.

FIG. 4 is a front view of a rack 402 that includes one sub rack 420. The sub rack 420 shown in FIG. 4 includes seven nodes 34.

Figure 5:
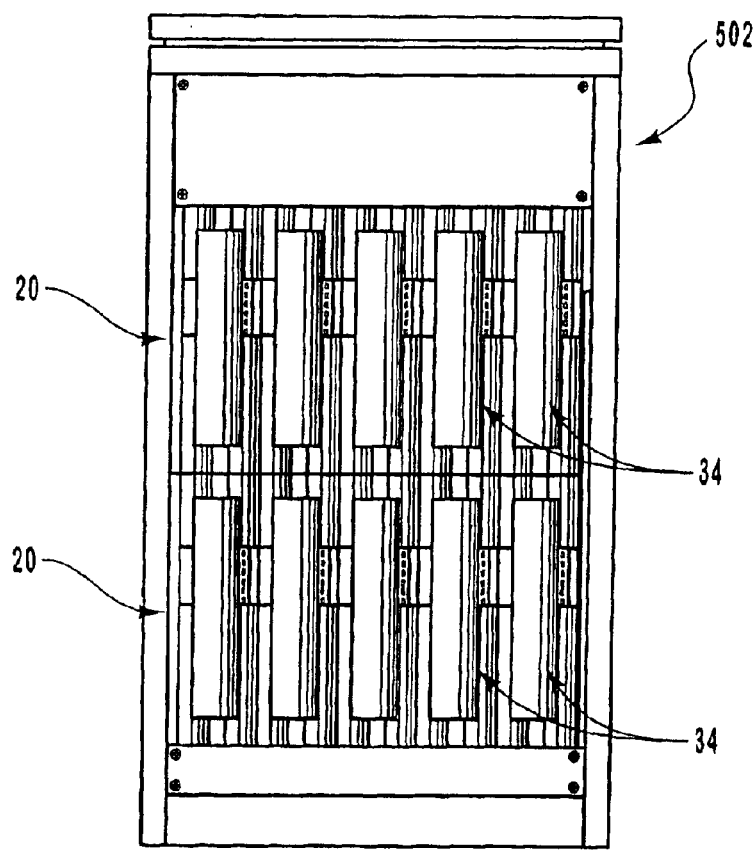
FIG. 5 is a front view of a rack that includes two sub racks.

FIG. 5 is a front view of a rack 502 that includes two sub racks 20. Each sub rack 20 shown in FIG. 5 includes five nodes 34. The rack 502 shown in FIG. 5 is a standard 19-inch rack (also referred to as an electronic cabinet or enclosure) that is commercially available.

Figure 6:
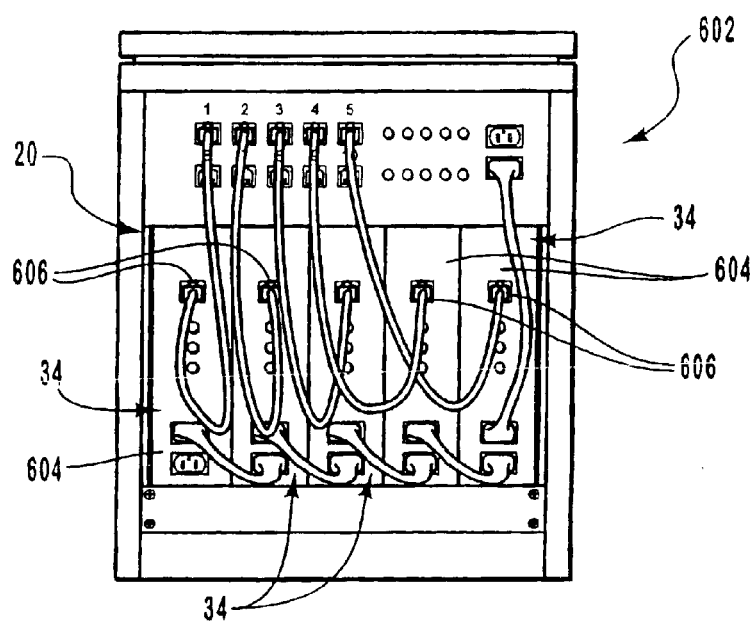
FIG. 6 is a rear view of a rack that includes one sub rack.

FIG. 6 is a rear perspective view of a rack 602 that includes one sub rack 20. The sub rack 20 shown in FIG. 6 includes five nodes 34. As shown, each node 34 includes a non-backplaned rear 604. Various electronic connections may be made at the non-backplaned rear 604. One or more non-backplaned communications ports 606 may be used on each node 34 for establishing electronic communications with other nodes 34 and components. For example, connectors and cabling commonly used with computer network interface cards may be used to enable electronic communications within the cluster. For example, the connections may be serial, parallel, high speed, fiber optic, USB, etc.

Figure 7:
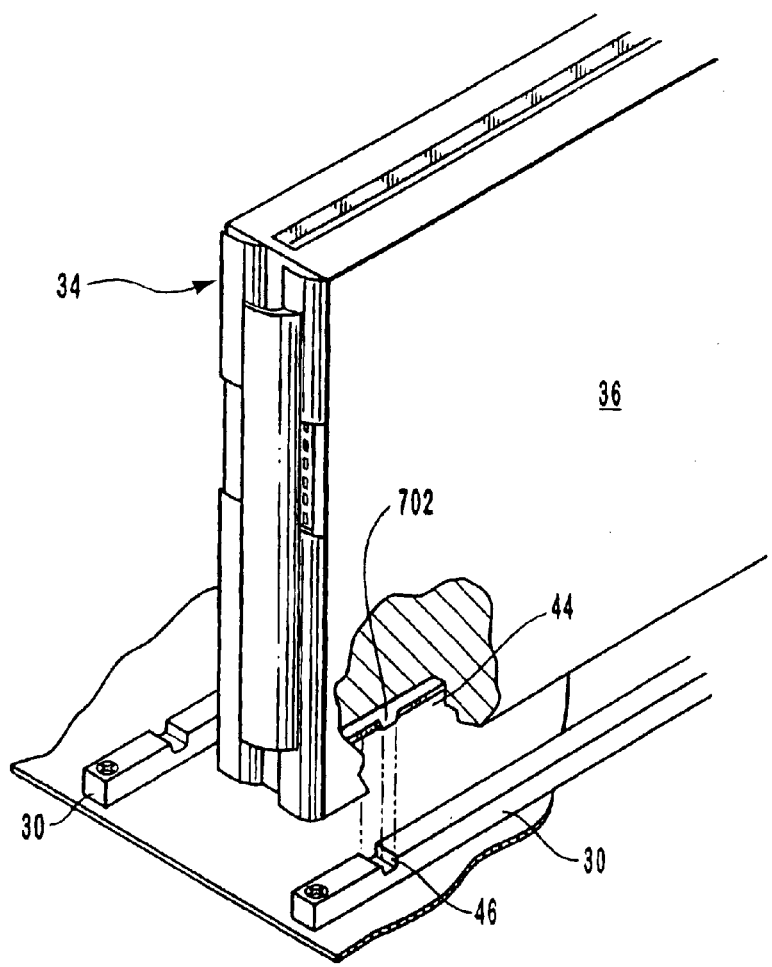
FIG. 7 is a cut-away view of a semi-locking mechanism.

FIG. 7 is a close-up cut-away view of the semi-locking mechanism. As shown, each bottom guide 30 may include an indentation 46 to mate with a projection 702 in the bottom groove 44 that provides a semi-locking mechanism that does not require tools to put the node 34 in place. The user simply slides the node 34 into the node space until the projection 702 fits into the indentation 46 and the node 34 seats itself into place. To unlock the node 34, a user simply either pushes or pulls the node 34 enough to bring the projection 702 out of the indentation 46 thus allowing free sliding of the node 34.

FIGS. 8A–8D illustrate close-up cross-sectional views of other embodiments of semi-locking mechanisms. In the embodiment shown in FIG. 8A, each bottom guide 830a may include an indentation 846a to mate with a projection 802a in the bottom groove 844a that provides the semi-locking mechanism. In operation, the user simply slides the node into the node space until the projection 802a fits into the indentation 846a and the node seats itself into place. To unlock the node, a user simply slightly lifts and then pulls the node enough to bring the projection 802a out of the indentation 846a thus allowing free sliding of the node.

Figure 8A:
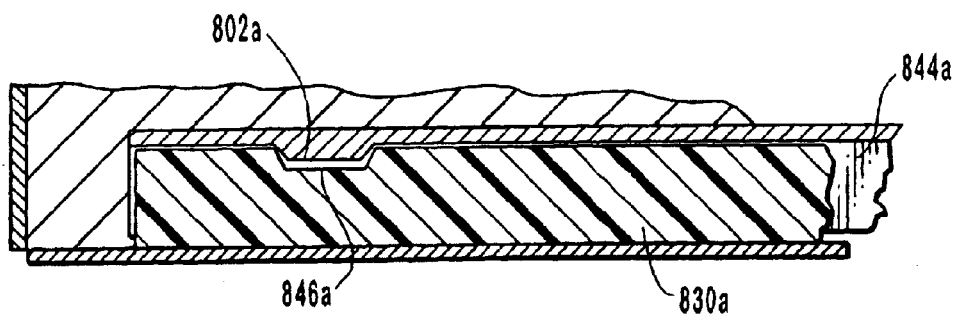
FIGS. 8A–8D are close-up cross-sectional views of other embodiments of semi-locking mechanisms.
Figure 8B:
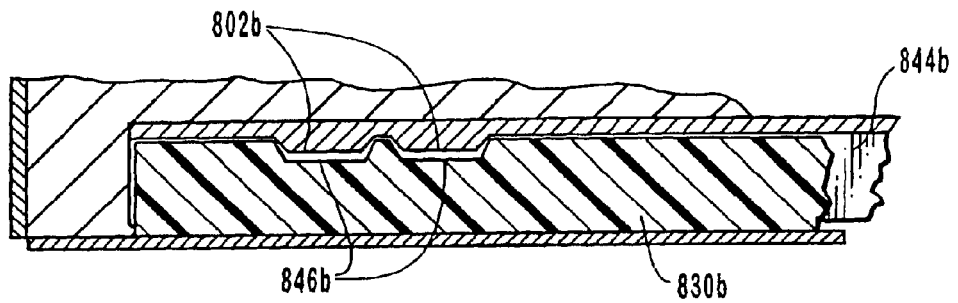
Figure 8C:
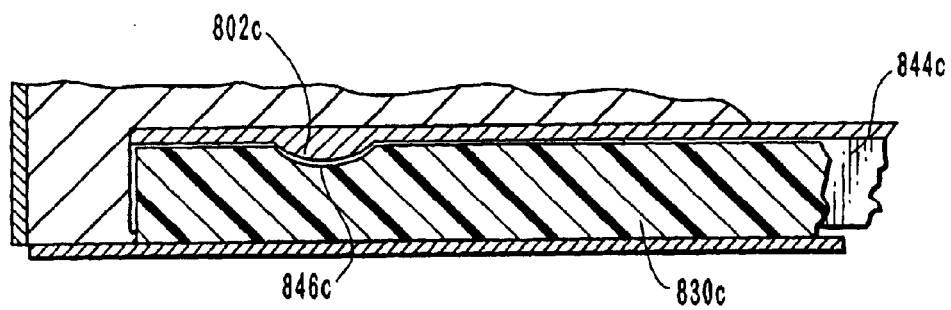
Figure 8D:
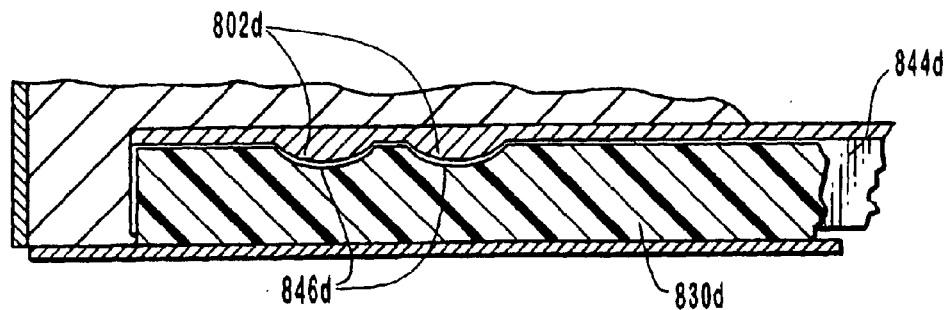

The embodiment shown in FIG. 8B illustrates each bottom guide 830b including two indentations 846b to mate with two projections 802b in the bottom groove 844b that provide the semi-locking mechanism. The embodiment shown in FIG. 8C illustrates each bottom guide 830c including an indentation 846c with a different shape than the indentation of FIG. 8A. The projection 802c in the bottom groove 844c that provides the semi-locking mechanism is of a shape to fit into the indentation 846c. FIG. 8D illustrates two projections 802d and two indentations 846d.

Figure 9:
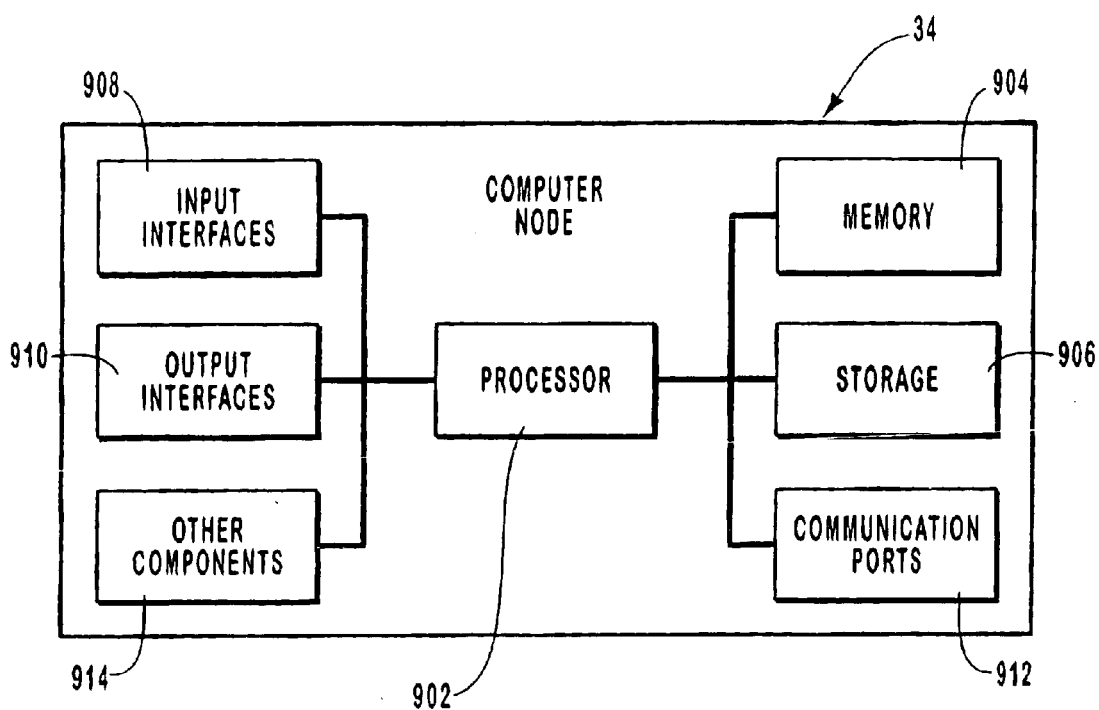
FIG. 9 is a block diagram of hardware components that may be used in an embodiment of a computer node.

FIG. 9 is a block diagram of hardware components that may be used in an embodiment of a node 34. As stated, the node 34 is simply a computer system 34 operating in a clustered environment. Many different types of computer systems may be used to implement the node 34 illustrated herein. The diagram of FIG. 9 illustrates typical components of a node 34 including a processor 902, memory 904, a storage device 906, an input interface 908, and an output interface 910. One or more communication ports 912 may also be included in the node 34. It will be appreciated by those skilled in the art that more components may be included in the node 34. For example, several input interfaces 908 may be included, such as interfaces for a keyboard, a mouse, a joystick, a touch screen, etc. In addition, several output interfaces 910 may be included such interfaces for a monitor, speakers, a printer, etc. Thus, those skilled in the art will appreciate that additional components may be added to the node 34 without detracting from the functionality to serve as a node 34.

The node 34 may include components typically found in desktop computers and that are commercially available. However, it will be appreciated by those skilled in the art that the node 34 computer is a broadly defined digital computer. A computer, as used herein, is any device that includes a digital processor capable of receiving and processing data. In current design, the node 34 typically is an IBM-compatible personal computer running the Linux operating system. Of course, other types of computers with different operating systems may be used. For example, an Apple computer or a UNIX workstation may be used as the node 34, or an IBM-compatible computer running the Microsoft Windows 95/98/2000 or NT operating system may be used.

The node 34 may use one or more communication ports 912 to communicate with the other nodes 34 and/or with other components. Standard communication packages and protocols are known by those skilled in the art for communicating through communication ports 912. The communication ports 912 used on the rear 604 of the node 34 are non-backplaned communication ports. Thus, the open rear portion of the sub-rack 20 and of the rack 602 allows users to make necessary connections between the nodes 34 at the rear of the rack.

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope.

What is claimed is:

1. A computer system for vertical placement in a computer system structure, the computer system comprising:

a processor;

a communications port in electronic communications with the processor for electronic communications;

memory in electronic communication with the processor for storing data; and a housing for the processor and the memory, the housing being substantially rectangular, the housing being configured such that the computer system may be vertically placed into the computer system structure by sliding the computer system into the computer system structure whereby the computer system slides back such that the communications port is accessible.

* * * * *